(12) United States Patent
Stewart

(10) Patent No.: US 9,367,794 B2
(45) Date of Patent: Jun. 14, 2016

(54) ACCURATE PERSISTENT NODES

(71) Applicant: Intelleflex Corporation, Santa Clara, CA (US)

(72) Inventor: Roger Green Stewart, Neshanic Station, NJ (US)

(73) Assignee: Intelleflex Corporation, San Jose, CA (US)

( * ) Notice: Subject to any disclaimer, the term of this patent is extended or adjusted under 35 U.S.C. 154(b) by 407 days.

(21) Appl. No.: 13/768,809

(22) Filed: Feb. 15, 2013

(65) Prior Publication Data
US 2013/0154806 A1    Jun. 20, 2013

Related U.S. Application Data

(62) Division of application No. 12/760,412, filed on Apr. 14, 2010, now Pat. No. 8,400,274, which is a division of application No. 11/124,485, filed on May 6, 2005, now Pat. No. 7,728,713.

(51) Int. Cl.
| | |
|---|---|
| H04Q 5/22 | (2006.01) |
| G08B 13/14 | (2006.01) |
| G01R 31/36 | (2006.01) |
| H01Q 11/12 | (2006.01) |
| H02H 9/00 | (2006.01) |
| G06M 3/02 | (2006.01) |
| G06K 19/07 | (2006.01) |
| G05F 3/16 | (2006.01) |
| H03F 3/45 | (2006.01) |

(52) U.S. Cl.
CPC . *G06M 3/02* (2013.01); *G05F 3/16* (2013.01); *G06K 19/0723* (2013.01); *H03F 3/45076* (2013.01)

(58) Field of Classification Search
CPC .......... H04Q 5/22; G08B 13/14; G01R 31/36
USPC .......... 340/10.1–10.5, 572.5; 342/42; 702/63, 702/75, 78, 79
See application file for complete search history.

(56) References Cited

U.S. PATENT DOCUMENTS

| | | | |
|---|---|---|---|
| 4,471,345 | A | 9/1984 | Barrett, Jr. |
| 4,638,237 | A | 1/1987 | Fernandez |
| 4,838,032 | A | 6/1989 | Maslaney et al. |
| 5,065,084 | A | 11/1991 | Oogita |

(Continued)

OTHER PUBLICATIONS

International Preliminary Examination Report from PCT Application No. PCT/US06/07962, dated Jan. 26, 2009.

(Continued)

*Primary Examiner* — Nam V Nguyen
(74) *Attorney, Agent, or Firm* — Zilka-Kotab, PC

(57) ABSTRACT

A calibrated gate biasing circuit according to one embodiment includes a switched capacitor precision resistor; and a voltage reference. An electronic circuit for initiating a change in state of a host device, according to another embodiment, includes a counter coupled to a host device, the counter counting at a fixed interval, wherein the counter is reset to zero upon receiving a command from a remote device, wherein the count is compared to a reference value, wherein the host device changes states if the count matches the reference value, wherein operation of the counter continues in spite of an interruption in power supply from a power source. Asymmetrical differential amplifiers are also disclosed, according to various embodiments.

5 Claims, 5 Drawing Sheets

(56) References Cited

U.S. PATENT DOCUMENTS

| | | | |
|---|---|---|---|
| 5,107,152 A * | 4/1992 | Jain et al. | 327/431 |
| 5,247,554 A * | 9/1993 | Yamada | 377/60 |
| 5,301,081 A * | 4/1994 | Podell et al. | 361/56 |
| 5,455,499 A | 10/1995 | Uskali et al. | |
| 5,521,601 A | 5/1996 | Kandlur et al. | |
| 5,530,702 A | 6/1996 | Palmer et al. | |
| 5,550,547 A | 8/1996 | Chan et al. | |
| 5,592,095 A | 1/1997 | Meadows | |
| 5,594,696 A | 1/1997 | Komarek et al. | |
| 5,721,535 A | 2/1998 | Ikefuji | |
| 5,751,220 A | 5/1998 | Ghaffari | |
| 5,883,582 A | 3/1999 | Bowers et al. | |
| 5,912,428 A * | 6/1999 | Patti | 102/215 |
| 5,963,144 A | 10/1999 | Kruest | |
| 5,965,997 A | 10/1999 | Alwardi et al. | |
| 6,104,333 A | 8/2000 | Wood, Jr. | |
| 6,198,381 B1 | 3/2001 | Turner et al. | |
| 6,215,280 B1 | 4/2001 | Cavazzini | |
| 6,265,963 B1 | 7/2001 | Wood, Jr. | |
| 6,297,734 B1 | 10/2001 | Richardson et al. | |
| 6,593,845 B1 | 7/2003 | Friedman et al. | |
| 6,636,146 B1 * | 10/2003 | Wehoski | 340/10.4 |
| 6,781,508 B2 | 8/2004 | Tuttle et al. | |
| 6,804,503 B2 | 10/2004 | Shohara et al. | |
| 6,816,062 B2 | 11/2004 | Preishuber-Pfluegi et al. | |
| 6,842,710 B1 | 1/2005 | Gehring et al. | |
| 6,961,546 B1 * | 11/2005 | Rofougaran et al. | 455/118 |
| 7,072,697 B2 | 7/2006 | Lappetelainen et al. | |
| 7,113,017 B2 | 9/2006 | Owen | |
| 7,154,329 B2 | 12/2006 | Douglas | |
| 7,161,469 B2 | 1/2007 | Turner et al. | |
| 7,224,712 B2 | 5/2007 | Taki et al. | |
| 7,362,212 B2 | 4/2008 | Burghard et al. | |
| 7,436,286 B2 | 10/2008 | Fischer et al. | |
| 7,441,211 B1 * | 10/2008 | Gupta et al. | 716/133 |
| 7,728,713 B2 | 6/2010 | Stewart | |
| 8,400,274 B2 | 3/2013 | Stewart | |
| 2002/0097143 A1 | 7/2002 | Dalglish | |
| 2002/0175806 A1 | 11/2002 | Marneweck et al. | |
| 2003/0169703 A1 | 9/2003 | Tamura | |
| 2004/0036575 A1 | 2/2004 | Patterson et al. | |
| 2004/0085190 A1 | 5/2004 | Tuttle et al. | |
| 2004/0140884 A1 | 7/2004 | Gallagher, III et al. | |
| 2004/0145454 A1 | 7/2004 | Powell et al. | |
| 2004/0201457 A1 | 10/2004 | O'Toole et al. | |
| 2006/0250220 A1 | 11/2006 | Stewart | |
| 2010/0194543 A1 | 8/2010 | Stewart | |

OTHER PUBLICATIONS

Restriction/Election Requirement from U.S. Appl. No. 11/124,485 dated Dec. 10, 2008.
Non-Final Office Action from U.S. Appl. No. 11/124,485 dated Mar. 25, 2009.
Final Office Action from U.S. Appl. No. 11/124,485 dated Nov. 25, 2009.
Notice of Allowance and Fee(s) Due from U.S. Appl. No. 11/124,485 dated Mar. 11, 2010.
Restriction/Election Requirement from U.S. Appl. No. 12/760,412 dated Jan. 3, 2012.
Non-Final Office Action from U.S. Appl. No. 12/760,412 dated Mar. 16, 2012.
Final Office Action from U.S. Appl. No. 12/760,412 dated Aug. 8, 2012.
Notice of Allowance and Fee(s) Due from U.S. Appl. No. 12/760,412 dated Nov. 26, 2012.
Stewart, U.S. Appl. No. 11/124,485, filed May 6, 2005.
Stewart, U.S. Appl. No. 12/760,412, filed Apr. 14, 2010.
Non-Final Office Action from U.S. Appl. No. 11/124,487, dated Oct. 26, 2006.
Stewart, U.S. Appl. No. 11/124,487, filed May 6, 2005.

* cited by examiner

ACCURATE PERSISTENT NODES

RELATED APPLICATIONS

This application is a divisional of U.S. patent application Ser. No. 12/760,412, entitled "ACCURATE PERSISTENT NODES" and filed Apr. 14, 2010; which is a divisional of U.S. patent application Ser. No. 11/124,485, entitled "ACCURATE PERSISTENT NODES" and filed May 6, 2005; from all of which priority is claimed and which are all incorporated by reference.

FIELD OF THE INVENTION

The present invention relates to timing circuits, and more particularly, this invention relates to systems and methods for one shot timing circuits (persistent nodes) with long timing cycles.

BACKGROUND OF THE INVENTION

Radio Frequency Identification (RFID) technology employs a radio frequency ("RF") wireless link and ultra-small embedded computer circuitry. RFID technology allows physical objects to be identified and tracked via these wireless "tags". It functions like a bar code that communicates to the reader automatically without requiring manual line-of-sight scanning or singulation of the objects. RFID promises to radically transform the retail, pharmaceutical, military, and transportation industries.

Several advantages of RFID technology are summarized in Table 1:

TABLE 1

| Identification without visual contact |
| --- |
| Able to read/write |
| Able to store information in tag |
| Information can be renewed anytime |
| Unique item identification |
| Can withstand harsh environment |
| Reusable |
| High Flexibility/Value |

As shown in FIG. 1, a basic RFID system 100 includes a tag 102, a reader 104, and an optional server 106. The tag 102 includes an integrated circuit (IC) chip and an antenna. The IC chip includes a digital decoder needed to execute the computer commands the tag 102 receives from the tag reader 104. The IC chip also includes a power supply circuit to extract and regulate power from the RF reader; a detector to decode signals from the reader; a back-scattering modulator to send data back to the reader; anti-collision protocol circuits; and at least enough EEPROM memory to store its EPC code.

Communication begins with a reader 104 sending out signals to find the tag 102. When the radio wave hits the tag 102 and the tag 102 recognizes the reader's signal, the reader 104 decodes the data programmed into the tag 102. The information can then be passed to a server 106 for processing, storage, and/or propagation to another computing device. By tagging a variety of items, information about the nature and location of goods can be known instantly and automatically.

The system uses reflected or "backscattered" radio frequency (RF) waves to transmit information from the tag 102 to the reader 104. Since passive (Class-1 and Class-2) tags get all of their power from the reader signal, the tags are only powered when in the beam of the reader 104.

The Auto ID Center EPC-Compliant tag classes are set forth below:
Class-1
 Identity tags (RF user programmable, maximum range ~3 m)
Class-2
 Memory tags (8 bits to 128 Mbits programmable at maximum ~3 m range)
 Security & privacy protection
Class-3
 Battery tags (256 bits to 64 Kb)
 Self-Powered Backscatter (internal clock, sensor interface support)
 ~100 meter range
Class-4
 Active tags
 Active transmission (permits tag-speaks-first operating modes)
 Up to 30,000 meter range In RFID systems where passive receivers (i.e., Class-1 tags) are able to capture enough energy from the transmitted RF to power the device, no batteries are necessary. In systems where distance prevents powering a device in this manner, an alternative power source must be used. For these "alternate" systems (also known as active or semi-passive), batteries are the most common form of power. This greatly increases read range, and the reliability of tag reads, because the tag doesn't need power from the reader. Class-3 tags only need a 10 mV signal from the reader in comparison to the 500 mV that a Class-1 tag needs to operate. This 2,500:1 reduction in power requirement permits Class-3 tags to operate out to a distance of 100 meters or more compared with a Class-1 range of only about 3 meters.

It is well known that the performance of dock-door and other RFID reader systems could be improved if the Inventory Session state persistence of the RFID tags could be accurately controlled. In a dock door scenario, a reader at a dock door instructs all tags to wake up, causing them to set their Inventory Status state to an "A-state".

RFID tags, especially passive tags, have no real state memory more than a few milliseconds. They literally live off of the power from the reader. If the signal from the reader is blocked, the tag dies. Accordingly, persistent nodes have been added to tags. Persistent nodes currently consist of an analog one-shot. Although most of the tag memory is volatile, the persistent nodes are used to remember whether the tag has been counted or not. If power is interrupted, the persistent node typically defaults the tag into a wake A-state after a delay. The reader can then methodically singulate and query the tags and put them back to sleep ("B-state"). The persistent node will indicate whether the tag has been put to sleep for a few milliseconds (ms), thereby keeping the tag from reverting by default to the wake state after a momentary power interruption. However, persistent nodes, which rely on an analog capacitor, have heretofore been found to be very inaccurate, taking up to minutes to cause the reversion.

Another problem is that in many situations, either the tag is moving or the reader is moving, causing new tags to enter and leave the field. If the reader instructs the tags to wake up, and other tags subsequently enter the field, the other tags won't get the wake up signal and so the reader won't know they are there. One solution would be to send out another wake up command, but that would re-wake all of the tags, defeating the purpose. Another proposed solution is to instruct all the tags to go from the A-state to the B-state and count all of the tags, then recount all of the tags while moving them from the B-state to the A-state. By counting twice, the reader should pick up all of the tags. But this is very time consuming and wasteful, as the entire process has to be performed twice.

Thus, there is a great need for RFID tags that can store one or more "persistent" states accurately for long periods of time. The ideal tag would set its Inventory Status state (either the "A-state" or "B-state" corresponding to the "Session" that it is in) based on the most recent command it received from the Reader. The tag should then retain its Inventory Status state (either A or B) for typically 500 ms whether power is available during this interval or not. The tag also should reset the timing of its persistent state every time it receives a valid Select or other valid command appropriate to the state of the tag. Once the 500 ms interval is exceeded, the tag should automatically revert to its "A-state". While this is a relatively straight-forward design task for battery-powered tags, this has so far proved an impossible goal for passive tags due to the intermittent nature of their power supply.

The disclosed circuit achieves accurate control of persistent nodes with durations of up to several seconds and does so independently of whether the power supply remains steady or is interrupted during that interval.

SUMMARY OF THE INVENTION

The solution proposed herein avoids such things as having to count each tag at a dock door twice. In order to avoid counting every tag twice, the system needs to know that the tag will revert to the A-state, and precisely when it will revert to the A-state. If it is known for sure that the tag will revert to the A-state in about 500 ms, then there is no need to count each tag twice, because the system can make certain that all tags will be in the A-state. Because all tags are in the A-state, the reader need only count the tags that are in the A-state. This is not only more reliable than results obtained with heretofore known persistent nodes, but allows an accurate count in half the time of the current state of the art method.

A preferred embodiment includes a "one-shot" event timer with a long-time-constant (preferably about 500 ms in the United States) that is insensitive to whether the tag is powered during that interval or not. While some success has been achieved with ultra-long-time-constant RC-type circuits, the timing of these circuits is impossible to control accurately and vary by factors of 10× or more. A preferred embodiment of the present invention is based on a combination of two new circuits: (a) a power capture circuit that preferably isolates the circuit from the power supply variations on the chip and (b) an Ultra-Low-Power ("ULP") counter circuit that preferably runs at a very low frequency rate, e.g., about 80 Hz; is self-calibrating such that many tags can calibrate themselves at low-cost using a common reader; and consumes so little power that it can run for a full second or longer on the energy stored on a tiny (e.g., 100 pf) capacitor on the chip itself.

A calibrated gate biasing circuit according to one embodiment includes a switched capacitor precision resistor; and a voltage reference.

An electronic circuit for initiating a change in state of a host device, according to another embodiment, includes a counter coupled to a host device, the counter counting at a fixed interval, wherein the counter is reset to zero upon receiving a command from a remote device, wherein the count is compared to a reference value, wherein the host device changes states if the count matches the reference value, wherein operation of the counter continues in spite of an interruption in power supply from a power source.

An asymmetrical differential amplifier, according to one embodiment, includes a first transistor having a channel length of length A and a channel width of width B; a second transistor having a different geometry than the first transistor such that the second transistor has a different threshold voltage than the first transistor, wherein the amount of bias is greater than the mismatch of the threshold voltages of the transistors of the differential amplifier.

An asymmetrical differential amplifier in another embodiment has a first output when a source voltage is greater than a voltage on a node, wherein the differential amplifier has a second output when the source voltage is less than or equal to the voltage on the node.

Other aspects and advantages of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

BEST MODE FOR CARRYING OUT THE INVENTION

The following description is the best embodiment presently contemplated for carrying out the present invention. This description is made for the purpose of illustrating the general principles of the present invention and is not meant to limit the inventive concepts claimed herein.

The following specification describes systems and methods for providing an accurate persistent node that has a very predictable time constant that is independent of whether power is interrupted. Accordingly, the reader need only periodically issue select commands, and the tag will not revert to another state (e.g., will stay asleep). However, if the reader does not issue a command, the tag will revert after some predetermined time period, e.g., about 200-2000 ms.

Figure 1:
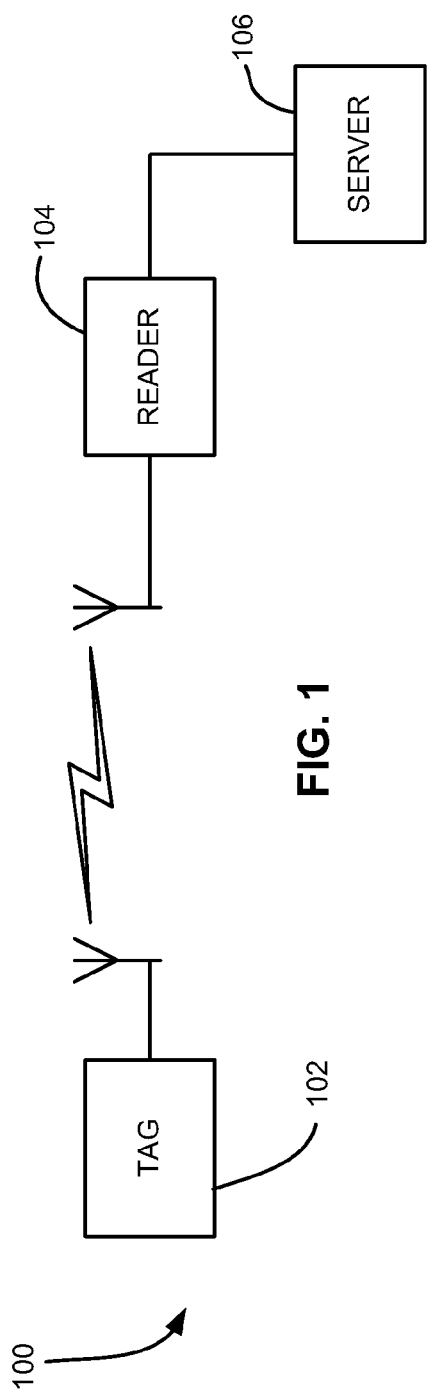
FIG. 1 is a system diagram of an RFID system.

Many types of devices can take advantage of the embodiments disclosed herein, including but not limited to Radio Frequency Identification (RFID) systems and other wireless devices/systems; pacemakers; portable electronic devices; remote controllers for televisions, audio devices, and other electronic devices; smoke detectors; etc. To provide a context, and to aid in understanding the embodiments of the invention, much of the present description shall be presented in terms of an RFID system such as that shown in FIG. 1. It should be kept in mind that this is done by way of example only, and the invention is not to be limited to RFID systems, as one skilled in the art will appreciate how to implement the teachings herein into electronics devices in hardware and/or software. Examples of hardware include Application Specific Integrated Circuits (ASICs), printed circuits, monolithic circuits, reconfigurable hardware such as Field Programmable Gate Arrays (FPGAs), etc. Further, the methodology disclosed herein can also be incorporated into a computer program product, such as a computer disc containing software. Further, such software can be downloadable or otherwise transferable from one computing device to another via network, nonvolatile memory device, etc.

Figure 2:
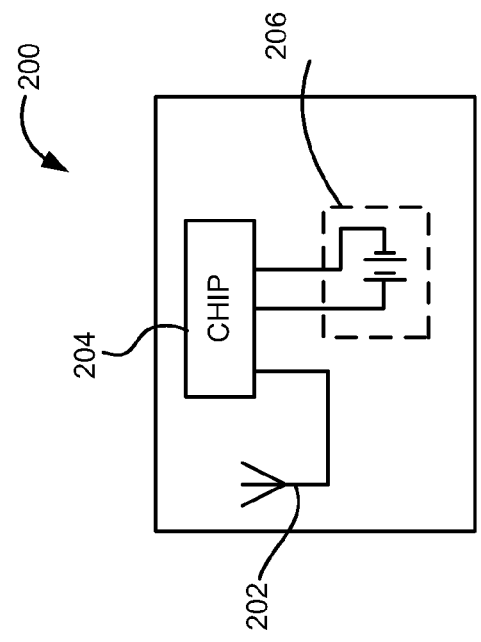
FIG. 2 is a high level circuit diagram showing a circuit for implementation in a RF device according to one embodiment.

FIG. 2 illustrates a radio frequency data communication device 200, e.g., RFID tag, at least a portion of which embodies the invention. The radio frequency data communication device 200 includes an integrated circuit 204, a power source 206 connected to the integrated circuit 204 to supply power to the integrated circuit 204, and at least one antenna 202 connected to the integrated circuit 204 for radio frequency transmission and reception by the integrated circuit 204. For purposes of this disclosure, including the appended claims, the term "integrated circuit" and "circuit" shall be defined as a combination of interconnected circuit elements associated on or within a continuous substrate. For purposes of this disclosure, including the appended claims, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). For purposes of this disclosure, including the appended claims, the term "substrate" refers to any supporting structure, including, but not limited to, the semiconductive substrates described above as well as printed circuit boards (PCBs). In the illustrated embodiment, the integrated circuit 204 is a monolithic integrated circuit. For purposes of this disclosure, including the appended claims, the term "monolithic integrated circuit" shall be defined as an integrated circuit wherein all circuit components are manufactured into or on top of a single chip of silicon or layer of a semiconductor. The integrated circuit 204 will be described in greater detail below. The power source 206 is a battery and/or a power supply circuit that extracts and regulates power from the RF reader signal.

The radio frequency data communication device 200 can be included in any appropriate housing or packaging, made of plastic or any other suitable material. The device 200 is of a small size that lends itself to applications employing small housings, such as cards, miniature tags, etc. Larger housings can also be employed. The device 200, housed in any appropriate housing, can be supported from or attached to an object in any desired manner; for example using double sided tape, glue, lanyards, leash, nails, staples, rivets, or any other fastener. The housing can be sewn on to an object, hung from an object, implanted in an object (hidden), etc. A description of illustrative RFID tags, systems, and methods of user are disclosed in U.S. Patent Appl. Pub. No. 2004/0201457A1 to O'Toole et al., which is herein incorporated by reference. Note that the present embodiments improve upon 2004/0201457A1, which did not allow a tag to switch from one state to another state and does not allow the reader to query the tag during an inactive state. The present embodiments allow the tag to switch from one state to another state meanwhile allowing the reader to query the tag in either state.

Figure 3:
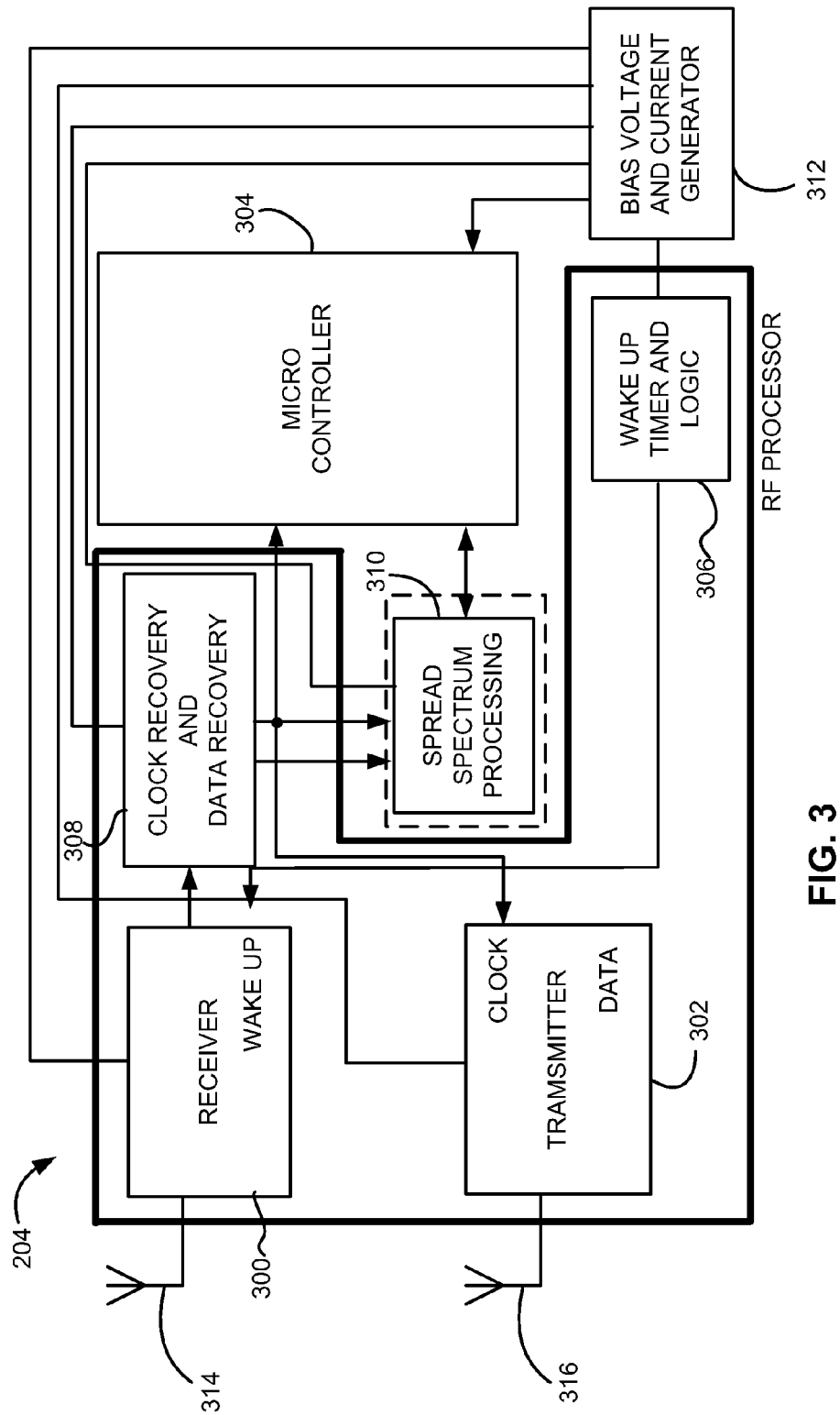
FIG. 3 is a high level circuit diagram of a monolithic semiconductor integrated circuit that may form part of the circuit of FIG. 2.

Various configurations are possible for the antenna 202. The integrated circuit 204 includes a receiver 300 and a transmitter 302 (FIG. 3). In one embodiment, separate antennas 314 and 316 are provided for receiver and transmitter of the integrated circuit 204. In another embodiment (FIG. 2), a single antenna is shared by the receiver and transmitter sections. In one embodiment, the antenna is defined by conductive epoxy screened onto a card or housing. In the illustrated embodiment, the antenna is conductively bonded to the integrated circuit via bonding pads.

In an embodiment where a single antenna is employed, that single antenna preferably comprises a folded dipole antenna defining a continuous conductive path, or loop, of microstrip. Alternatively, the antenna can be constructed as a continuous loop antenna.

If the power source 206 is a capacitance, the capacitance can take any suitable form. Preferably, the capacitance will be integrated into the monolithic integrated circuit. Instead of using a capacitance, a battery or any other suitable power source can be employed.

FIG. 3 is a high level circuit schematic of the integrated circuit 204 utilized in the devices of FIG. 2. In the embodiment shown in FIG. 3, the integrated circuit 204 is a monolithic integrated circuit. More particularly, in the illustrated embodiment, the integrated circuit 204 includes the receiver 300, the transmitter 302, a micro controller or microprocessor 304, a wake up timer and logic circuit 306, a clock recovery and data recovery circuit 308, and a bias voltage and current generator 312.

In one embodiment, a spread spectrum processing circuit 310 is also included in the integrated circuit 204 and formed relative to the single die. In this embodiment, signals received by the receiver 300 are modulated spread spectrum signals. In an illustrated embodiment, the modulation scheme for replies sent by the transmitter 302 is selectable. One of the available selections for replies sent by the transmitter 302 is modulated spread spectrum.

Several embodiments are described below with reference to specific frequencies, voltages, amperages, capacitances, etc. to exemplify the preferred low power aspects of the embodiments. It should be kept in mind that these are provided by way of example only, and any suitable frequency, voltage, amperage, capacitance, etc. can be used, as will be apparent to one skilled in the art.

Figure 4:
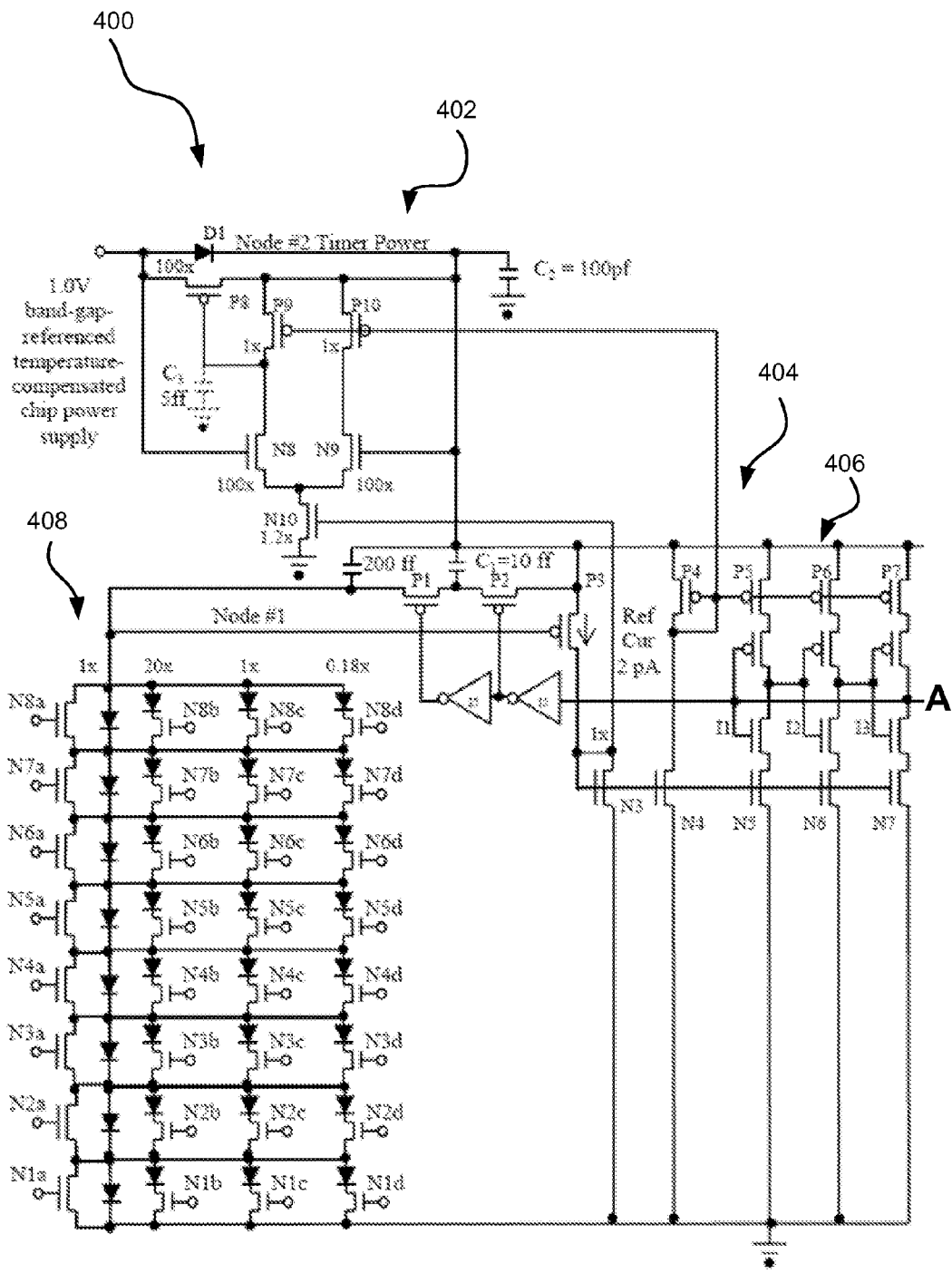
FIG. 4 is a system diagram of an accurate persistent node circuit according to one embodiment.
Figure 4:
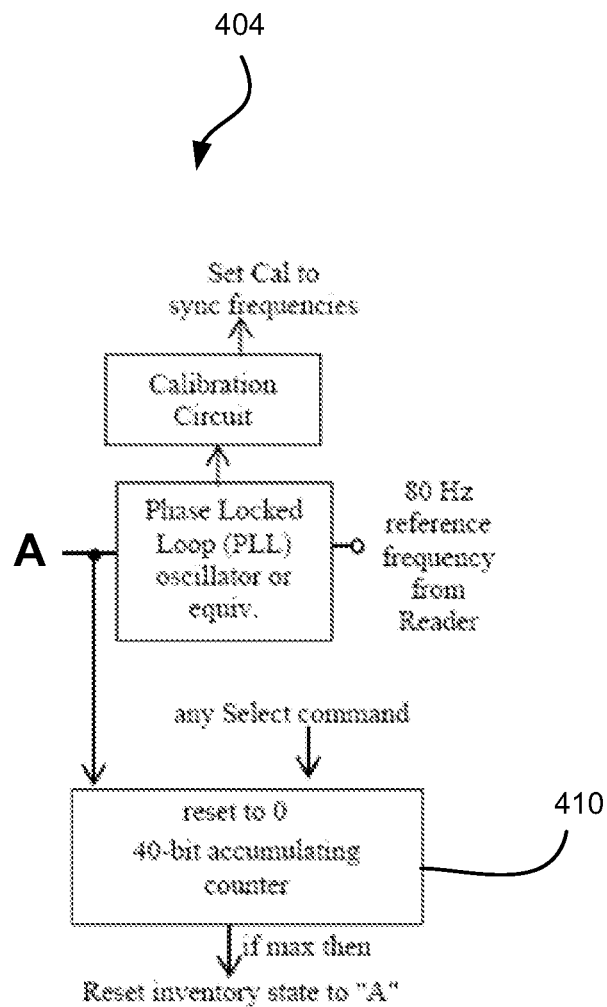

FIG. 4 illustrates a circuit 400 that can function as an accurate persistent node. The circuit 400 functions as a "one-shot" event timer circuit with an extremely-long-time-constant (e.g., a time interval of about 2-2000 ms, preferably about 500 ms) that is insensitive to whether the tag is powered during that interval or not. The circuit 400 is based on a combination of two new circuits: (a) a power capture circuit 402 and (b) an Ultra-Low-Power ("ULP") counter 404. In a preferred embodiment, shown in FIG. 4, the power capture circuit 402 isolates the circuit from the power supply variations on the chip. Also in a preferred embodiment, the ULP counter 404 runs at a low frequency rate, e.g., about 80 Hz; is self-calibrating such that many tags can calibrate themselves at low-cost using a common reader; and consumes very little power, for instance, such that it can run for a full second or longer on the energy stored on a tiny 100 pf capacitor on the chip itself.

It is well known that radio signals at a particular frequency reflect off of objects in an environment and create areas known as "nulls" where the signal is difficult or impossible to discern. Thus, even though a tag may be very close to the reader, it may be positioned in a null, and as such cannot communicate with the reader and may not be able to gather power from the carrier signal. Accordingly, the United States Federal Communications Commission (FCC) currently requires that RFID systems change frequency at least every 400 ms. By setting the time constant of the circuit 400 to a value greater than the 400 ms frequency hopping interval, the tag is guaranteed the opportunity to gather power from one frequency or the other. In other words, even though the tag may be in a null at one frequency, it will be able to gather power at the other frequency.

If the tag cannot retain the sleep state for at least 400 ms, the first time the tag hits a null, it may lose power entirely, forget that it was put to sleep, and may reawaken to an awake state as soon as power is restored. This in turn would create problems during counting of the tags. Embodiments described herein, particularly when used with wireless systems, can avoid this problem by having a time constant that is greater than the frequency hopping interval of the jurisdiction in which used.

Power Capture Circuit:

The power capture circuit 402 detects, captures, and stores the highest value voltage present on the IC chip. In a passive RFID tag, this power would typically be captured from the RF reader carrier signal. As shown in FIG. 4, a preferred embodiment of the power capture circuit includes transistors P8, P9, P10, N8, N9, N10 plus diode D1, and capacitor C2.

It is well known that a simple "power capture" circuit may consist only of D1 and C2. This simple circuit may in fact be used in some embodiments to build accurate persistent nodes, especially where C2 cannot be made larger than 100 pf. However the simple diode circuit suffers from two drawbacks: (1) the timer power supply at node-2 would be one diode drop (or typically 0.5V) lower than the chip's regulated supply level, and this difference could be significant when the chip's power supply level is only 1V; (2) both the voltage drop and impedance across the diode can vary widely such that the voltage at node #2 would be poorly regulated and controlled.

Adding the power capture circuit consisting of P8, P9, P10, N8, N9, and N10 solves both of these problems. N8 and N9 together form a differential amplifier that constantly compares the chip power supply level with that of the timer power supply on node-2. Preferably, the transistor structure of N8 is arranged to have a threshold voltage slightly higher than N9 so that the differential amplifier is imbalanced. The imbalance between N8 and N9 is preferably a difference of about 5 mV. Whenever the chip supply is more than 5 mV higher than the timer power supply, N8 turns on (harder than N9) thereby directing 80% of the current flowing in N10 to flow though P9, which pulls the gate of P8 close to ground. This turns P8 on and clamps node-2 to the chip power supply level. Without P8, the voltage at node-2 could easily vary by hundreds of millivolts and the source impedance could be millions of ohms. Turning on P8 reduces the source impedance to typically 10,000 ohms, and clamps the node-2 voltage to within a few millivolts.

However if the chip voltage begins to drop, N8 and N9 detect this, such that N9 turns on harder and redirects 80% of the N10 to flow instead through P10. With only 20% of the current flowing though N8, P9 drives the gate of P8 to within a few millivolts of the node-2 voltage thereby turning P8 off and preventing current from flowing back from node-2 to the chip power supply.

Addition of transistors P8, P9, P10, N8, N9, and N10 effectively turn the simple diode sampling circuit of D1 and C2, into a "super diode" with a forward drop of only a few millivolts and a thousand times lower source impedance.

This power capture circuit works best when C2 is maximized, C3 is minimized, and the chip power supply doesn't drop too quickly. In this example, the C2/C3 ratio is 100 pf/5 ff or 20,000:1. With 1 pA flowing through P9 and assuming that the chip power supply doesn't drop at a rate faster than about 100V/sec, P8 can be turned off in less than 1 ms in response to a falling chip power supply as necessary to prevent a significant loss in voltage at node-2. Note however, that if the chip power supply were to drop too quickly, node-2 could be completely discharged through P8 before P9 was able to turn P8 off.

Therefore in applications where the chip power supply could drop faster, the time constants should be adjusted as follows: t (P8–C2)>>t (P9–C3). This can be achieved by either increasing C2, decreasing the conductivity of P8, further decreasing the capacitance at the gate of P8 (if possible), or increasing the current flowing though P9. For example, increasing the size of C2 to 10,000 pf would also allow the P9 current to be increased to 100 pA such that t (P9–C3) is increased to 100 μs and t (P8–C2) is decreased to less than 10 μs. This would result in less than a 30 mV loss at node-2 even if the chip voltage supply were to drop instantly to 0V.

The Ultra-Low-Power Reference Oscillator:

The counter circuit 404 shown in FIG. 2 includes a precision calibrated Ultra-Low-Power ("ULP") oscillator 406 that runs at a low frequency rate, e.g., of only about 80 Hz (preferably lower than 100 KHz in alternate embodiments), and consumes, for example, only about 10 pA of power, and preferably less than 1 mA in alternate embodiments. The oscillator in this embodiment is designed to continue to operate for a full second or more on power supplied by storage capacitor, C2 even after the chip voltage supply has collapsed.

The oscillator shown is a Voltage Controlled Oscillator ("VCO") formed with three inverters (I1,I2,I3) connected with feedback to form a ring oscillator. The frequency of this oscillator is controlled by matched pairs of current mirrored transistors P5/N5, P6/N6, P7/N7. The current flowing in these transistors is in turn controlled both by the "2 pA reference current" flowing in P3 and the analog current multiplier circuit formed by N1, N2, N3, and N4. In a preferred embodiment, none of these P or N transistors ever really turn "on" at all; instead they operate close to their minimum leakage-current-limit deep in their respective sub-threshold regions.

Figure 5:
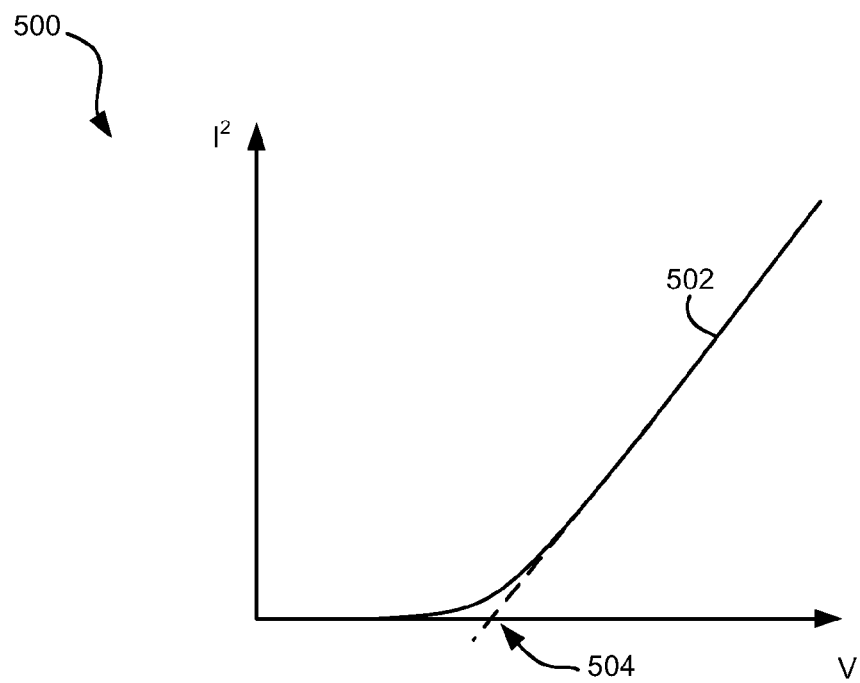
FIG. 5 is a chart of voltage vs. current.
Figure 6:
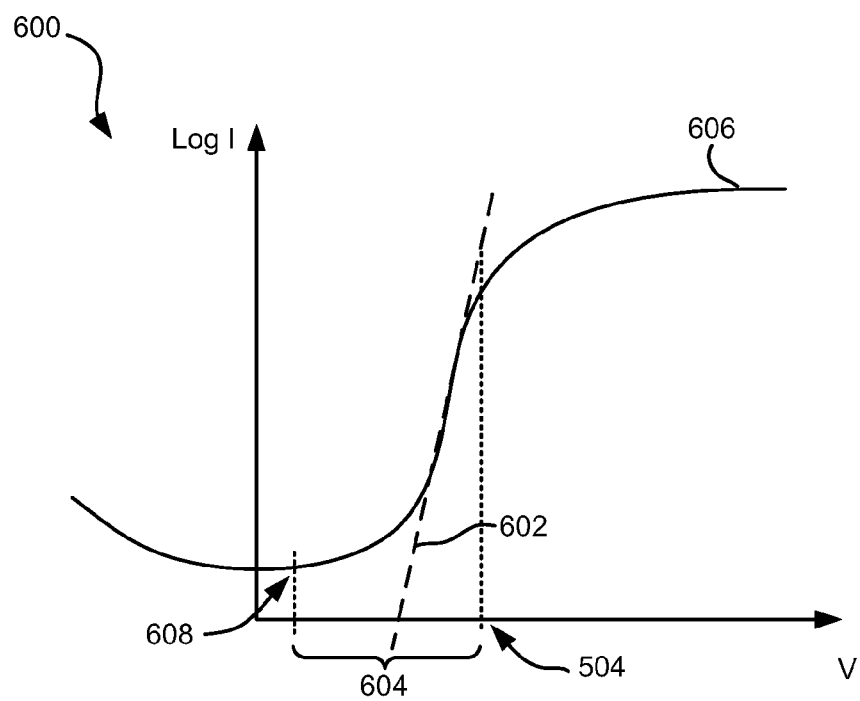
FIG. 6 is a logarithmic chart of voltage vs. current.

FIG. 5 illustrates an exemplary chart 500 of current (I) vs. voltage (V) for a circuit operating in the sub-threshold regime according to one embodiment. As shown, the plot 502 of current vs. voltage has a slope. Extrapolated from the slope is an estimated threshold voltage 504. It is at this point 504 that those skilled in the art consider the threshold voltage. Turning to FIG. 6, which is a logarithmic chart 600 of the same data, a subthreshold slope 602 can be matched to the curve of the subthreshold region 604 of the plot 606. The subthreshold region 604 is considered to be between the threshold voltage 504 and the lowest leakage point 608 of the device.

In a preferred embodiment, the circuit 400 of FIG. 4 operates at least about 100 mV below a threshold voltage thereof, and at least about 100 mV above a voltage at a lowest leakage point thereof.

Stated in terms of current, the circuit 400 of FIG. 4 preferably operates at current levels at least about 10 times lower than a threshold current thereof, and at current levels at least about 10 times higher than at the lowest leakage point thereof.

Calibration of the Ultra-Low-Power Reference Oscillator:

While the preceding discussion shows how the reference oscillator will work with an accurate 2 pA reference current source, no such current sources are known to exist in the IC chip world. For example, just trying to scale a conventional PMOS transistor to source only this much current (with it's gate grounded and its source at 1.2V) would require the channel length to be scaled to over 100,000,000 microns or 100 meters—hardly a practical design. And in any case, the accuracy and stability of any 2 pA current source would be extremely poor without a method for accurately calibrating this current. FIG. 4 therefore includes a practical circuit for generating and calibrating the 2 pA current-source. Of course, the circuit will work with higher and potentially lower current sources, e.g., 2 nA, etc. However, the benefits of ultra low power consumption are especially important where the power supply consists only of on-chip capacitance.

The calibration matrix 408 shown in FIG. 2 is digitally adjustable with a combination of both fine and coarse adjustment bits. In this example, use of an ultra-low-bias current of only 0.2 pA reduces the offset voltage across the parallel combinations of the 4 diodes (a,b,c,d which total 22.1× in size) to only about 120 mV. The following description will describe two embodiments by which the tag can calibrate itself.

In this example the VCO operates at 80 Hz, but it could operate at either a higher or lower frequency. The output of the reference VCO is buffered and clipped to form a square wave and used to drive P1 and P2. P1, P2 and their associated capacitors form a "switched capacitor" precision resistor. The bias current flowing through this network is nominally: $I=(C1)\times(f)\times(\Delta V)=10$ ff×80 Hz×0.25V=0.2 pA. Nominally, this 0.2 pA bias current also flows through the calibration matrix and induces an offset voltage across the calibration matrix of 0.75V—assuming that five of the bypass calibration transistors are turned off. With a nominal P threshold voltage of 0.6 V, the gate of P3 will be biased at 0.25V below its source but 0.35 V less than its threshold voltage, and will therefore operate deep in its sub-threshold region. In theory P3 will inject exactly 2 pA into the circuit.

However in practice, all of these values can vary so much that the current through P3 would vary widely unless the circuit is calibrated to improve its accuracy. This is achieved with the 32-transistor calibration matrix 408 shown in FIG. 4. There are at least two simple algorithms that can be used by the chip to adjust its calibration matrix.

In the first algorithm, all 32 of the calibration transistors are initially turned on and the calibration matrix is shorted out completely. The tag reference frequency will then initially exceed that of the reader reference frequency and this fact is detected by the PLL shown in FIG. 2. In response, the calibration logic starts turning off each of the N1$a$, N2$a$, N3$a$ . . . transistors in sequence until the PLL detects that the tag frequency has dropped below that of the reader reference oscillator (or until N1$a$ through N8$a$ are all off). Each disconnected "a-series" transistor increases the voltage to the gate of P3 by 120 mV. If and when the PLL detects that the tag frequency has dropped below the reader reference frequency of 80 Hz, the calibration circuit turns back on the last two "a-series" transistors that it had switched off. The "a-series" coarse calibration sequence is now complete.

Next, the tag begins the "b-series" calibration sequence by turning off each of the N1$b$, N2$b$ . . . transistors in sequence until the PLL detects that the tag frequency has dropped below that of the reader reference oscillator (or until N1$b$ through N8$b$ are all off). Each disconnected "b-series" transistor decreases the size of the diode from 22.18× to 2.18×, and this increases the voltage to the gate of P3 by 60 mV. This is because the forward-current/junction-area of the diode is an exponential function of the forward voltage with a slope of about 60 mV/decade at room temperature. If and when the PLL detects that the tag frequency has dropped below the reader reference frequency of 80 Hz, the calibration circuit turns on the last two "b-series" transistors that it had switched off. The "b-series" calibration sequence is now complete.

Next, the tag begins the "c-series" calibration sequence by turning off each of the N1$c$, N2$c$ . . . transistors in sequence until the PLL detects that the tag frequency has dropped below that of the reader reference oscillator (or until N1$c$ through N8$c$ are all off). Each disconnected "c-series" transistor decreases the size of the diode from 2.18× to 1.18×, and this increases the voltage to the gate of P3 by 20 mV, based on the equation $\Delta V=(\log_{10} 2.1/1.18)(60$ mv/decade$)=20$ mV. As before, if and when the PLL detects that the tag frequency has dropped below the reader reference frequency of 80 Hz, the calibration circuit turns on the last "c-series" transistor on that it had switched off. The "c-series" calibration sequence is now complete.

Finally, the tag begins the "d-series" calibration sequence by turning off each of the N1$d$, N2$d$ . . . transistors in sequence until the PLL detects that the tag frequency has dropped below that of the reader reference oscillator. Each disconnected "d-series" transistor decreases the size of the diode from 1.18× to 1.0×, and this increases the voltage to the gate of P3 by 5 mV, based on the equation $\Delta V=(\log_{10} 1.1/1.0)(60$ mv/decade$)=5$ mV. The calibration circuit then stops and locks the digital inputs to each of the calibration transistors in memory, e.g., EEPROM or static memory, until the tag receives another "Calibration" command from the reader. The full auto-calibration sequence is now complete.

In a second alternative algorithm, the actual offset voltage is first measured for all useful combinations of the 32 transistor calibration matrix. Out of thousands of possibilities, the designer then pre-selects 64 of those combinations that form the best uniform monotonic set with a 5 mV interval and a total range of 0.32V with the center value selected to make the nominal current flowing through P3 exactly 2 pA. This look up table can then be implemented as a memory with 64 inputs and 32 outputs (or less). The 64 inputs are driven with a 6-bit counter. The algorithm begins with the counter at 0, which produces an offset voltage 0.18V below the nominal value. This causes the reference oscillator to initially operate faster than the reader reference oscillator. The PLL detects the difference like it did in the first algorithm, and increments the counter one step at a time until the tag oscillator equals or exceeds that of the reference oscillator. The tag then stops incrementing and locks that value into the 6-bit counter—until the tag receives another calibration command. If the tag receives a command to re-calibrate, the tag would then re-set the 6-bit counter to 0 and re-run the calibration sequence.

If necessary, even finer adjustments in the calibration diode matrix could be made by connecting even more diodes of different sizes in parallel thereby controlling the forward drop by increments as small as 0.1 mV. The net effect is to adjust the voltage across the calibration matrix such that at the nominal 0.2 pA bias current, there is just the right combination of diodes so that the input voltage to P3 is exactly what is necessary to produce the 2 pA reference current. The negative feedback employed during the calibration sequence ensures the tag will calibrate itself accurately despite the variability in threshold voltages, leakage currents, etc.

Once calibrated, the bias voltage at Node #1 is maintained by negative feedback through P1 and P2. If, for example, Node #1 were to decrease, then the current through P3 would increase and the reference frequency would also increase. This would increase the current flowing through P1 and P2 which would restore Node #1 to the original value set by the calibration sequence. Conversely, a rising voltage on node-1 would cause the reference frequency to slow down, reduce the bias current, and thereby restore the node-1 voltage to its original value.

The signal received from the oscillator 406 is accumulated in an accumulating counter 410, where the count represents a progression of time. When the count in the accumulating counter 410 matches a maximum value, the tag reverts to a desired state, e.g., A-state. Here, the maximum value would represent the time constant of the circuit. Alternatively, the value stored in the accumulating counter 410 can be compared to a reference value that represents the desired time constant of the overall circuit. The reference value can be stored on the tag in memory or logic. Preferably, the reference value can be set/reset by the reader, etc. In this way, the timing constant can be tuned or varied on demand.

Note that the output from the oscillator 406 can be manipulated, e.g., by frequency dividers or multipliers, prior to reaching the accumulating counter 410.

Also note that a select command from the reader can be used to reset the accumulating counter 410 to zero. The accumulating counter 410 can be set to reset by any command, or by a select command specific to the tag, e.g., a command that matches a tag ID or a value stored elsewhere in the tag. If no select command is received, the counter will generate a value based on a signal from the oscillator 406, and reset the tag state to a selected state (if not already in that state).

The reader can also cause the tag to revert to the wake A-state by transmitting a wake command.

While circuits like those shown in FIG. 2 can achieve initial frequency and current calibration accuracies of better than ±10%, this accuracy may be degraded by changes in temperature or by subsequent variations in the power supply voltage. The best results are achieved by minimizing the variability of the power supply voltage using either a band-gap regulator or a battery power supply. In addition, the regulated power supply could compensate for both the temperature effect on the P3 threshold voltage and the 2 mV/degree variation of the calibration diodes. If necessary, the accuracy can also be further improved by periodic re-calibration of the tag.

Also note that in other embodiments, the counter circuits, oscillators, etc. described herein can be replaced with the circuits described in copending US patent application entitled "BATTERY MONITOR", referenced above. Such embodiments are particularly useful where larger currents and/or capacitances are desired, such as in battery powered tags.

There has thus been described embodiments that permit the integration of accurate "one-shot" timing circuits with long timing cycles into monolithic ICs. These timing circuits can continue to operate properly for extended periods even after the power supply voltage has been lost. Use of these embodiments can more than double the tag read rates in many critical RFID applications.

In a method of use, an RFID reader sends an interrogation signal to one or more RFID tags in range of the reader. One skilled in the art will appreciate that any suitable communication protocol, including security features, can be used. A tag receiving the signal responds with a tag ID. The reader can then use that tag ID to address that particular tag, causing the tag to transmit its stored data. The stored data can be any variety of information, and is normally associated with the article to which the tag is attached. The reader can then tell the tag to turn-off for now (B-state) so that it will not continue to respond to the interrogation signal. The reader will then select another tag ID and poll that tag for its data, and so on until all of the tags have been read. Because the circuits described herein cause the tag to revert to the wake state (A-state) in a very predictable time, the reader can make sure that all tags are initially in the A-state during the query period by ensuring that no select commands are received by the tags within the reader field for at least 0.5 seconds. If no wake up signal is sent to turn on the tags, they will automatically turn back on after a preselected time has expired, i.e., after the time constant of the persistent node circuits described herein.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A calibrated gate biasing circuit, comprising:
   a switched capacitor precision resistor comprising at least two transistors and at least two corresponding capacitors, wherein a bias current flowing through the switched capacitor precision resistor is about 0.2 picoamperes (pA); and
   a matrix of forward biased diodes coupled to an outlet of the switched capacitor precision resistor.

2. The circuit of claim 1, wherein the matrix of forward biased diodes is calibrated based on a reference frequency.

3. The circuit of claim 2, wherein the reference frequency is received from a remote device.

4. The circuit of claim 1, wherein the circuit is embodied on a Radio Frequency Identification (RFID) tag.

5. An RFID system, comprising:
   an RFID tag implementing the circuit of claim 1; and
   an RFID reader in communication with the RFID tag.

* * * * *